United States Patent [19]
Petty

[11] Patent Number: 5,187,722
[45] Date of Patent: Feb. 16, 1993

[54] FREQUENCY SYNTHESIS USING FRACTIONAL FREQUENCY MULTIPLICATION

[75] Inventor: Norman W. Petty, Boulder, Colo.

[73] Assignee: AT&T Bell Laboratories, Murray Hill, N.J.

[21] Appl. No.: 566,572

[22] Filed: Aug. 13, 1990

[51] Int. Cl.[5] .................. H04L 7/033; H03D 3/24
[52] U.S. Cl. .................. 375/118; 375/119; 455/260; 331/25
[58] Field of Search ........... 375/118, 119, 120, 81, 375/82, 83; 455/254, 255, 257, 258, 259, 260, 265, 266; 331/18, 25, 30, 34, 1 A; 329/307; 328/15, 16, 55, 155; 377/47

[56] References Cited

U.S. PATENT DOCUMENTS

| | | | |
|---|---|---|---|
| 4,492,936 | 1/1985 | Albarello et al. | 375/62 |
| 4,641,323 | 2/1987 | Tsang | 375/119 |
| 4,688,237 | 8/1987 | Brault | 328/15 |
| 4,847,875 | 7/1989 | Choi | 375/120 X |
| 4,949,357 | 8/1990 | Sehier | 375/120 X |
| 5,018,170 | 5/1991 | Wilson | 375/120 |
| 5,055,800 | 10/1991 | Black et al. | 331/1 A |

Primary Examiner—Curtis Kuntz
Assistant Examiner—Young Tse
Attorney, Agent, or Firm—David R. Padnes

[57] ABSTRACT

Frequency synthesis apparatus for providing a desired frequency which is greater than and a fractional multiple, N/M, of a reference signal frequency utilizes a fractional multiplier in the feedback path of a phase-locked loop. The fractional multiplier provides a multiplication of M/N on the feedback signal. Advantageously, this technique can be utilized in either analog or digitally-implemented phase-locked loops and can be coupled with the use of a fractional multiplier in the feedforward path of the digitally-implemented phase-locked loop to improve jitter performance.

9 Claims, 4 Drawing Sheets

5,187,722

FREQUENCY SYNTHESIS USING FRACTIONAL FREQUENCY MULTIPLICATION

TECHNICAL FIELD

The present invention relates to signal synthesis and, more particularly, to a technique for synthesizing signals whose frequency is both greater than and a fractional multiple of a reference signal frequency.

BACKGROUND OF THE INVENTION

In synchronous communications systems, it is typically necessary to derive a clocking signal from a reference signal. When the reference signal frequency is an integral multiple (N) of the desired signal frequency, the latter can be obtained as the output of a divide-by-N counter that is clocked by the reference signal. On the other hand, when the desired signal frequency is an integral multiple of the reference signal frequency, the former can be generated using a phase-locked loop. In many applications, there is oftentimes not a simple integral relationship between the reference signal frequency and the desired signal frequency. Instead, the reference signal frequency is some fractional multiple of the desired signal frequency, where the fractional multiple is a noninteger and is either less than or greater than 1. Moreover, in such applications, the prior art technique used to synthesize the desired signal frequency from the reference signal frequency is a function of the value of the fractional multiple.

Where the fractional multiple is less than 1, the desired signal frequency can be readily obtained from the output of a fractional multiplier which is clocked by the reference signal. Problems, however, arise when the fractional multiple is greater than 1 and, in general, are due to either limitations in the operating characteristics of available circuit devices and/or the cost of obtaining devices with the required operating characteristics. These problems are particularly burdensome in telecommunications applications where the required clocking signals for circuit devices are derived from reference signals available in the transmission line. These clocking rates have, in general, increased and are greater than and a fractional multiple of the available reference signal frequency. Synthesizing the desired signal frequency in such applications in a manner which meets the required system objectives, such as jitter and the like, has been extremely difficult and, at times, impossible to obtain using prior art techniques.

It would therefore be desirable if a signal synthesis technique could be developed which would overcome these limitations.

SUMMARY OF THE INVENTION

In accordance with the present invention, a fractional multiplier is placed in the feedback path of a phase-locked loop. The fractional multiplication provided is equal to the ratio of the reference signal frequency to the desired frequency. Advantageously, this technique can be utilized in either analog or digitally-implemented phase-locked loops and can be coupled with the use of a fractional multiplier in the feedforward path of the digitally-implemented phase-locked loop to improve jitter performance.

DETAILED DESCRIPTION

Figure 1:
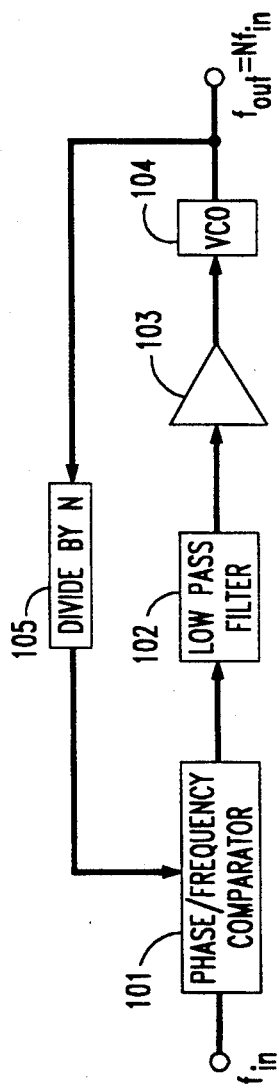
FIGS. 1-3 are block-schematic diagrams of prior art techniques utilizing a phase-locked loop to synthesize a desired signal frequency from a reference signal frequency.
Figure 2:
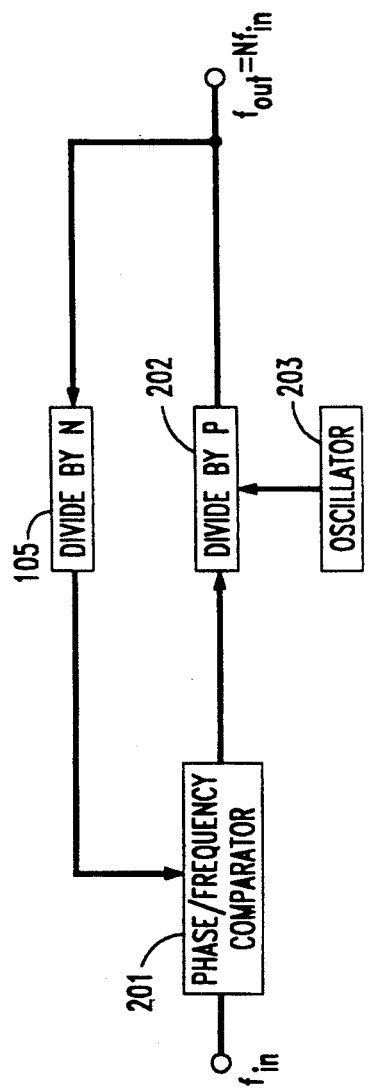

FIGS. 1 and 2 show prior art schemes respectively utilizing an analog or digitally-implemented phase-locked loop for obtaining a desired analog signal whose frequency ($f_{out}$) is a multiple, N, of a reference signal frequency ($f_{in}$). In either implementation, the reference signal is coupled to a phase/frequency comparator which generates an "error" signal by comparing the phase or frequency of this signal to a feedback signal coupled through divide-by-N circuit 105. The descriptor "error" is used to denote the fact that the phase comparator output signal is indicative of any frequency or phase difference between the reference signal and the signal generated by voltage-controlled oscillator (VCO) 104 or the divided output of oscillator 203 provided by divide-by-P circuit 202.

In the analog implementation of FIG. 1, the error signal generated by phase/frequency comparator 101 is an analog signal which is coupled through a serial connection of low-pass filter 102, amplifier 103 and is then supplied to VCO 104 for the purpose of varying the VCO frequency. The digital implementation of FIG. 2 is similar to the analog implementation of FIG. 1 and also uses divide-by-N circuit 105 in the feedback loop. In the digital implementation, however, the output of phase/frequency comparator 201 is a digital signal which controls the divisor in divide-by-P circuit 202 which, in turn, operates upon the output signal frequency of oscillator 203. P is a predetermined integer which is selected based on the desired phase jitter requirements. Specifically, as is well-known, the percent phase jitter for digital phase-locked loops is $$\frac{100\Delta P}{P},$$

where $\Delta P$ is the change in the value of P during operation of the phase-locked loop. Since $\Delta P$ is generally equal to 1, the percent phase jitter is approximated by 100/P. Accordingly, the larger the value of P, the lower the percent phase jitter. The problem, however, is that the frequency of oscillator 203 is P times the desired signal frequency. Accordingly, the use of this implementation places constraints on the desired signal frequency which can be obtained with existing and low-cost technology or requires considerably more expensive technologies to implement the oscillator and divide-by-P counter. Moreover, system applications arise which cannot provide the desired signal frequency and required percent phase jitter with existing technologies even if circuit costs are not an issue.

Figure 3:
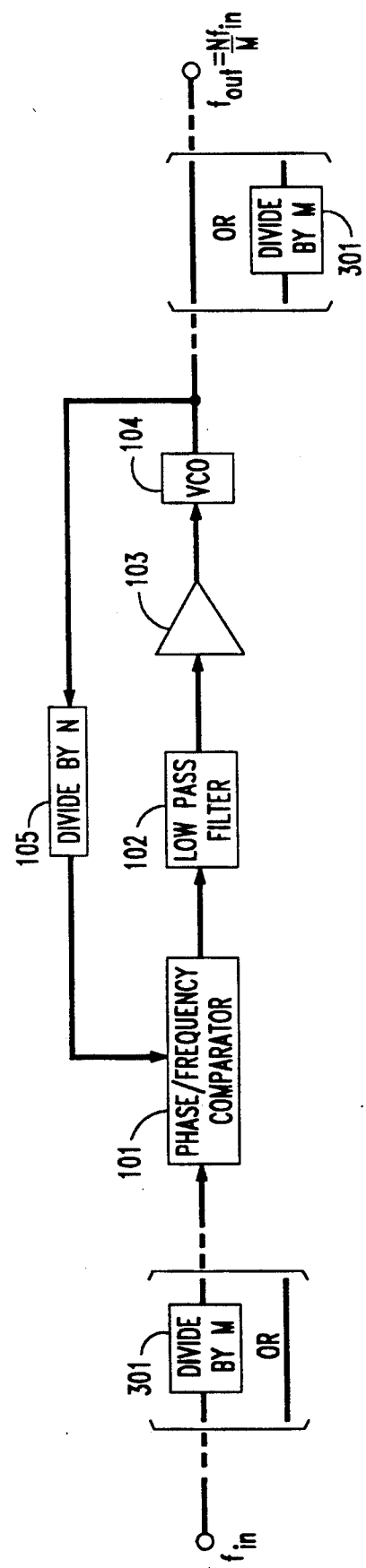

FIG. 3 shows a prior art, analog-implemented phase-locked loop for realizing a desired signal whose frequency ($f_{out}$) is both greater than and a fractional multiple of a reference signal frequency ($f_{in}$). The fractional multiple is designated as N/M where N and M are predetermined integers and N>M. The phase-locked loop includes phase/frequency comparator 101, low-pass filter 102, amplifier 103, VCO 104 and divide-by-N circuit 105 which all function in the same manner as in FIG. 1. A divide-by-M circuit 301 is advantageously located in either the reference signal input path so as to divide the $f_{in}$ input to phase/frequency comparator 101 by M or is located in the VCO output signal path to divide the VCO output signal frequency by M. When disposed in the reference signal input path, circuit 301 serves as a prescaler and this arrangement is particularly useful for applications when the required frequency $f_{in}$ is too low to be practical for commercially available oscillators which generate this frequency. Specifically, the prescaler allows the use of a higher frequency reference signal and the use of a divide-by-N circuit 105 in the feedback path permits the VCO to operate at N times the frequency which would otherwise be required. This arrangement, however, has shortcomings which stem from the fact that the error signal at the output of the phase/frequency comparator must be well filtered or it will induce incidental frequency modulation of the VCO output, i.e., a periodic variation of the VCO frequency about the desired frequency $$\frac{N}{M} f_{in}.$$

This problem is exacerbated by the fact that the VCO is often running at many times the input signal frequency. In this regard, note that in FIG. 3 the VCO frequency is N/M times the reference signal frequency $f_{in}$. To avoid this problem, a rather large and relatively complex filter 102 is required for the low frequencies and the use of divide-by-M circuit 301 as a prescaler causes the phase-locked loop to respond slowly to any change in the reference signal frequency. On the other hand, if divide-by-M circuit 301 is disposed in the VCO output signal where it serves as a postscaler, the phase-locked loop will quickly track changes in the reference signal frequency and a filter having the burdensome low frequency characteristics is not required in the phase-locked loop. However, with divide-by-M circuit 301 functioning as a postscaler, the VCO frequency is M times higher than that required when this circuit functions as a prescaler. Actual system applications make these limitations of either disposition of divide-by-M circuit 301 even clearer. For example, to frequency lock an RS-232 port baud rate generator at 14.7456 MHz to a 160-kilobit data link requires a fractional multiplication $$\left(\frac{M}{N}\right) \text{of } \frac{25}{2304}.$$

If implemented using the circuit of FIG. 2 with divide-by-M circuit 301 disposed as a postscaler in the VCO output signal path, the VCO frequency is 368.64 MHz which is well beyond the capabilities of CMOS or TTL devices. On the other hand, using the arrangement of FIG. 2 with circuit 301 serving as a prescaler in the reference signal input path, the phase/frequency comparator 101 is operating at 69.4 Hz and filter 102 is physically large as it must filter out components down to dc.

The present invention overcomes these limitations and can be realized in either an analog or digitally-implemented phase-locked loop. In either of these arrangements, the divide-by-N circuitry in the prior art is replaced by fractional multipliers which can be easily constructed using binary rate multipliers, digital finite state machines, or digital differential analyzers that provide an output signal whose frequency is M/N times the reference signal frequency.

Figure 4:
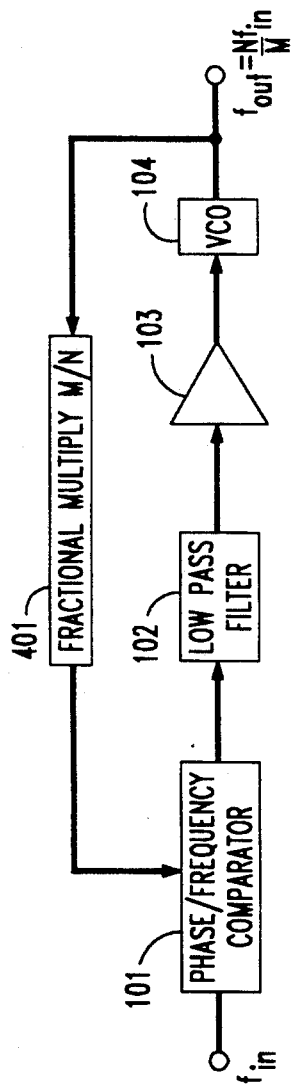
FIGS. 4 and 5 respectively are block-schematic diagrams of analog and digitally-implemented phase-locked loops which incorporate the present invention.
Figure 5:
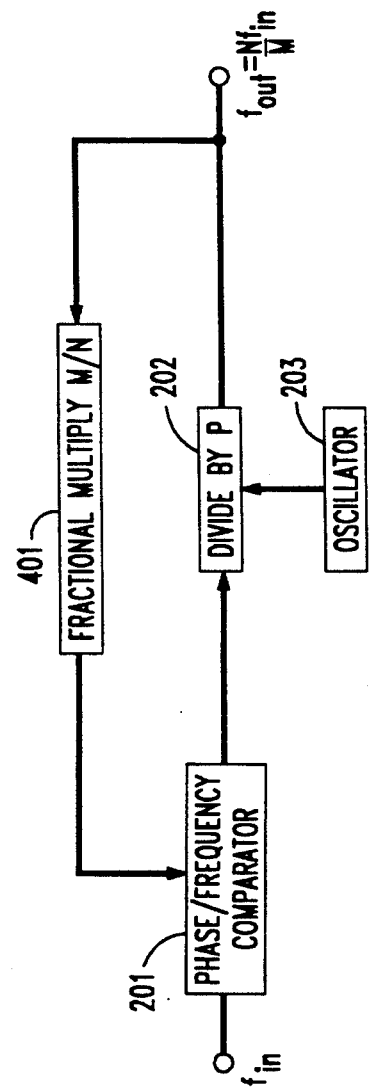

In the analog implementation shown in FIG. 4, the phase-locked loop includes phase/frequency comparator 101, low-pass filter 102, amplifier 103, VCO 104 and fractional multiplier 401. Multiplier 401, which multiplies the VCO output signal by M/N, is disposed in the feedback loop between the output of VCO 104 and phase/frequency comparator 101. Advantageously, this circuitry has the same quick response and easily providable filter characteristics as the arrangement of FIG. 3 with the divide-by-M circuit 301 serving as a postscaler, but does not have this arrangement's high frequency VCO requirement. The present invention, as shown in FIG. 5, can be realized within a digitally-implemented phase-locked loop. In FIG. 5, the phase-locked loop includes phase/frequency comparator 201, divide-by-P circuit 202, oscillator 203 and fractional multiplier 401, the latter again disposed in the feedback path. The percent phase jitter of this arrangement, as discussed above, is approximated by the relationship 100/P which, in turn, determines the frequency of oscillator 203. Again, the lower the required percent phase jitter, the higher the oscillator frequency. For certain circuit applications, the required oscillator frequency can be beyond that readily and/or economically obtainable with current device technology.

Figure 6:
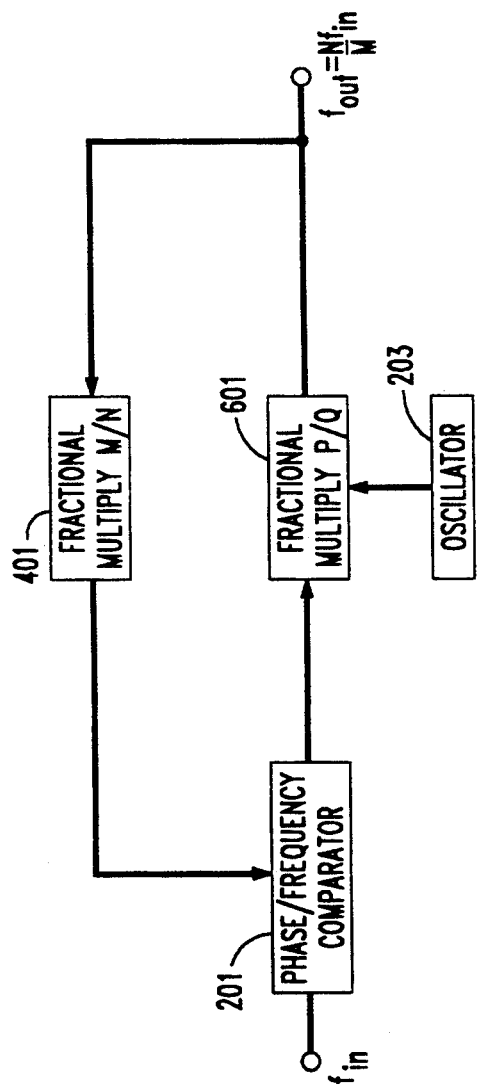
FIG. 6 is a block-schematic diagram of the digitally-implemented phase-locked loop of FIG. 5 which further incorporates circuitry to reduce phase jitter.

FIG. 6 shows another embodiment of the digitally-implemented phase-locked loop of FIG. 5 which overcomes the high frequency requirement for oscillator 203 for a low percent phase jitter. As before, fractional multiplier 401 is connected in the feedback path between fractional multiplier 601, whose purpose will be discussed, and phase/frequency comparator 201. The use of fractional multiplier 601, which multiplies the oscillator 203 output signal by P/Q, where P and Q are each a predetermined integer greater than 1 and P/Q is $\leq 1$, advantageously avoids the high frequency and jitter problems of the prior art because the frequency of oscillator 203 is the fraction Q/P times the desired frequency which is $$\frac{N}{M} f_{in}.$$

The integers P and Q are selected to provide the required phase jitter pursuant to the relationship percent phase jitter is $$100\left(1 - \frac{P}{Q}\right).$$

This selection then sets the oscillator frequency at Q/P times the desired output signal frequency of $$\frac{N}{M} f_{in}.$$

During phase-locked loop operation, the integer P is varied by the output of phase/frequency comparator 201.

While the present invention has been disclosed with reference to specific embodiment, other arrangements should be apparent to those of ordinary skill in the art. For example, while the use of binary rate multipliers, finite state machines and digital differential analyzers has been disclosed for implementing the fractional multiplier, the present invention is not limited to these circuits. Furthermore, the implementation of the present invention can take many forms, such as discrete components and/or integrated circuits including programmable logic devices. Finally, while the use of fractional multiplier 601 is shown within FIG. 6, this multiplier can be used for improving the phase jitter performance of other phase-locked loop arrangements. For example, in FIG. 2, multiplier 601 could replace divide-by-P circuit 202 to advantageously reduce the frequency requirement of oscillator 203.

I claim:

1. Apparatus for synthesizing a desired signal from a reference signal, said apparatus comprising
   a phase-locked loop for receiving said reference signal and generating said desired signal therefrom, said phase-locked loop having signal-conducting feedback and feedforward paths,
   means for multiplying the desired signal in the feedback path by a fraction, said fraction being equal to the ratio of the frequency of said reference signal to that of said desired signal, the numerator and denominator of said fraction each being unequal to 1, and means for multiplying a signal in the feedforward path by a predetermined fraction whose numerator and denominator are each greater than 1.

2. The apparatus of claim 1 wherein said phase-locked loop includes a serially connected filter, amplifier and voltage controlled oscillator.

3. The apparatus of claim 1 wherein said phase-locked loop includes a phase/frequency comparator, oscillator and circuitry for dividing the oscillator output signal frequency by a predetermined number, said number being varied by said comparator.

4. The apparatus of claim 1 wherein said predetermined fraction is selected to reduce phase jitter in said phase-locked loop.

5. A method of synthesizing a desired signal from a reference signal, said method comprising the steps of
   coupling said reference signal into a phase-locked loop and generating said desired signal therefrom, said phase-locked loop having signal-conducting feedback and feedforward paths,
   multiplying the signal in the feedback path by a fraction, said fraction being equal to the ratio of the frequency of said reference signal to that of said desired signal, the numerator and denominator of said fraction each being unequal to 1, and
   multiplying the signal in the feedforward path by a predetermined fraction whose numerator and denominator are each greater than 1.

6. Apparatus for reducing phase jitter in a desired signal, said apparatus comprising
   a phase-locked loop for receiving an input signal and generating said desired signal therefrom, and
   means for multiplying a signal generated by a signal source in said phase-locked loop, said multiplying means multiplying said signal generated by said signal source by a fraction whose numerator and denominator are each greater than one, said fraction being varied by circuitry within said phase-locked loop.

7. The apparatus of claim 6 wherein said fraction is less than 1.

8. The apparatus of claim 6 wherein said fraction is varied by a phase/frequency comparator in said phase-locked loop.

9. A method of reducing phase jitter in a circuit, said method comprising the steps of
   coupling an input signal to a phase-locked loop and generating a desired signal therefrom, and
   multiplying a signal generated by a signal source in said phase-locked loop, said multiplying step multiplying said signal generated by said signal source by a fraction whose numerator and denominator are each greater than one, said fraction being varied by a circuitry element in said phase-locked loop.

* * * * *